(12) United States Patent
Paik et al.

(10) Patent No.: US 6,878,435 B2
(45) Date of Patent: *Apr. 12, 2005

(54) HIGH ADHESION TRIPLE LAYERED ANISOTROPIC CONDUCTIVE ADHESIVE FILM

(75) Inventors: Kyung wook Paik, Daejeon (KR); Myung jin Yim, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/193,264

(22) Filed: Jul. 12, 2002

(65) Prior Publication Data

US 2003/0017327 A1 Jan. 23, 2003

(30) Foreign Application Priority Data

Jul. 19, 2001 (KR) .......................................... 2001-43429

(51) Int. Cl.[7] .................. B32B 27/08; B32B 27/38
(52) U.S. Cl. ..................... 428/215; 428/216; 428/323; 428/332; 428/334; 428/336; 428/337; 428/343; 428/354; 428/355 EP; 428/413; 428/414

(58) Field of Search ................... 428/215, 216, 428/332, 334, 336, 337, 354, 355 EP, 414, 323, 413, 343

(56) References Cited

U.S. PATENT DOCUMENTS

| | | | |
|---|---|---|---|
| 5,330,684 A | 7/1994 | Emori et al. | 252/512 |
| 5,686,703 A | 11/1997 | Yamaguchi | 174/259 |
| 6,020,059 A * | 2/2000 | Yamada et al. | 428/328 |
| 6,514,560 B2 * | 2/2003 | Paik et al. | 427/96 |
| 6,583,834 B1 * | 6/2003 | Uchiyama | 349/122 |

* cited by examiner

*Primary Examiner*—Monique R. Jackson
(74) *Attorney, Agent, or Firm*—Oliff & Berridge, PLC

(57) ABSTRACT

Disclosed is a triple layered ACA film adapted for enhancing the adhesion strength of a typical single layer Anisotropic Conductive Film or for enhancing the adhesion strength of the ACA film in flip chip bonding. The triple layered ACA film of the invention comprises: a main ACA film based upon epoxy resin and containing conductive particles having a particle size of 3 to 10 $\mu$m and optionally non-conductive particles having a particle size of 0.1 to 1 $\mu$m; and adhesion reinforcing layers based upon epoxy resin and formed at both sides of the main ACA film.

6 Claims, 2 Drawing Sheets

HIGH ADHESION TRIPLE LAYERED ANISOTROPIC CONDUCTIVE ADHESIVE FILM

BACKGROUND OF THE INVENTION

1. Field of the Invention

The present invention relates to an anisotropic conductive adhesive (ACA) film, and more particularly, a triple layered ACA film adapted for enhancing the adhesion strength of a typical single layer anisotropic Conductive Film (ACF) or for enhancing the adhesion strength of the ACA film in flip chip bonding.

2. Description of the Related Art

As well known in the art, the electronic packaging is a wide-ranging and various system fabricating technique including all processes related to from semiconductor device to final product. According to the sharply developing recent semiconductor technology, more than millions of cells are integrated while non-memory devices are developing with a tendency toward many I/O pin numbers, large die size, heat emission by a large quantity, high electric performance and so on. However, the electronic packaging technique for packaging the above devices does not catch up with the rapid development of the semiconductor art.

The electronic packaging is a very important technology in determining the performance, size, price, reliability and so on of the final electronic product, and more particularly, increasing its importance further in recent electronic products which pursue high electronic performance, ultra small size/high density, very high speed, permanent reliability and so on.

In conformance to the above trend, the flip chip bonding technology is one of technologies for electrically connecting a chip to a substrate and is recently obtaining the popularity.

However, the conventional flip chip bonding technique employs a complicated bonding process using solder including the steps of: coating solder flux on a substrate; aligning the substrate having surface electrodes with a chip having solder bumps; reflowing the solder bumps; removing remaining flux; and filling and hardening underfill. This disadvantageously makes the process complicated and final products expensive.

For the purpose of simplifying the complicated process, attention is recently paid to a wafer-based packaging technique by which a process is carried out by coating a wafer with a polymer material having functions of flux and underfill. Besides, researches for flip chip bonding techniques using a conductive adhesive are actively being carried out. This techniques have the following advantages: Price is low due to use of a general solder flip chip, an ultra microscopic electrode pitch can be obtained, the technique is environmental friendly since it does not use flux or lead component, and processes can be carried out at a low temperature.

The conductive adhesive is generally classified into an anisotropic conductive adhesive (ACA) and an isotropic conductive adhesive, and is basically composed of conductive particles such as Ni, Au/polymer and Ag and one selected from thermosetting resin, thermoplastic resin and blend-type insulating resin, i.e. mixed combination thereof.

FIG. 1A is a sectional view for illustrating a conventional ACA film. Referring to FIG. 1A, the ACA film 10 is based upon polymer resin where fine conductive particles 20 are dispersed to impart conductivity to the film 10. The ACA film 10 is attached at both sides with releasing films 30.

FIG. 1B is a sectional view for illustrating a flip chip bonding state by using the ACA film shown in FIG. 1A. First, one releasing film 30 is removed from one face of the ACA film 10, and the ACA film 10 is heat-pressed by its exposed face on a substrate 50. Then the other releasing film 30 is removed from the other face of the ACA film 10, an IC chip 40 having bumps 45 is aligned with electrodes 55 on a substrate 50. The IC chip 40 and the substrate 50 are heat-pressed together with the ACA film 10 so that the bumps 45 and the electrodes 55 are mechanically and electrically connected due to the transformation of the conductive particles of the ACF.

However, where the substrate 50 is a glass substrate such as FR-4 having a large thermal expansion coefficient and the IC chip 40 is a Si chip having a relatively small thermal expansion coefficient, the reliability of a flip chip package is disadvantageously degraded under thermal cycle because of thermal stress owing to the difference between the thermal expansion coefficients.

In order to solve this problem, an improved ACA film as shown in FIG. 1C has been proposed where non-conductive particles are contained by at least 30% by weight to reduce thermal expansion coefficient. Referring to FIG. 1C, more non-conductive particles 60 having a diameter smaller than the conductive particles 20 are contained in the ACA film 10 unlike FIG. 1A so as to reduce the thermal expansion coefficient of the ACA film 10.

The adhesion strength of the ACA film 10 is created due to the polymer resin. However, where the conductive and non-conductive particles 20 and 60 are contained by a large amount in the polymer resin like this, the polymer resin is reduced with the effective area to degenerate the interface adhesion and interface toughness thereby deteriorating the reliability of the flip chip package.

SUMMARY OF THE INVENTION

Accordingly, the present invention has been made to solve the above problems and it is an object of the present invention to provide a triple layered ACA film which still has strong adhesion strength in flip chip bonding even if non-conductive particles are contained for the purpose of enhancing the adhering force of a general single layer ACF or reducing thermal coefficient.

To accomplish the above object, there is provided a triple layered ACA film comprising: an epoxy resin-based main ACA film containing conductive particles having a particle size of 3 to 10 $\mu$m or optionally non-conductive particles having a particle size of 0.1 to 1 $\mu$m; and epoxy resin-based adhesion reinforcing layers formed at both sides of the epoxy resin-based main ACA film.

In the triple layered ACA film of the invention, the main ACA film may be formed by mixing and drying solid epoxy resin, liquid epoxy resin, solid phenoxy resin, solvent in which methylethylketone and toluene are mixed with each other, liquid imidazole hardener, the non-conductive particles having the particle size of 0.1 to 1 $\mu$m and 0 to 50% by weight with respect to an overall weight excluding a weight of the solvent and the conductive particles having the particle size of 3 to 10 $\mu$m and 5 to 20% by weight with respect to the overall weight excluding the weight of the solvent.

In the triple layered ACA film of the invention, the adhesion reinforcing layers each may further contain 5–10% by weight of conductive particles.

In the triple layered ACA film of the invention, the adhesion reinforcing layers each may be formed by mixing and drying solid epoxy resin, liquid epoxy resin, solid phenoxy resin, solvent in which methylethylketone and toluene are mixed with each other, and liquid imidazole hardener.

In the triple layered ACA film of the invention, the main ACA film preferably has a thickness range of 25–50 μm and each of the adhesion reinforcing layers has a thickness range of 1–10 μm.

The adhesion reinforcing layers each contain 0–10% by weight of thermoplastic resin.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

The following detailed description will present a preferred embodiment of the invention in reference to the accompanying drawings.

Figure 2A:
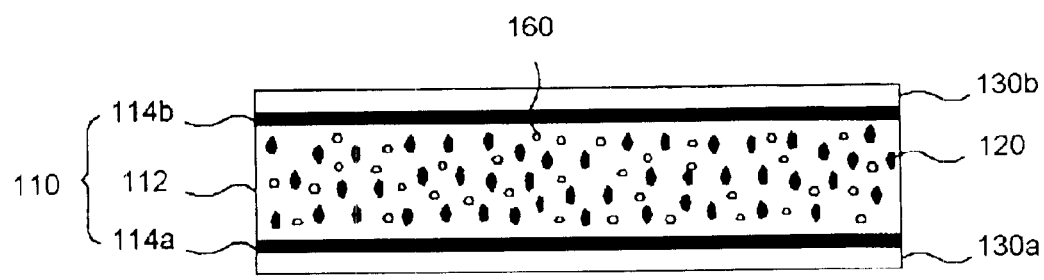
FIG. 2A is a sectional view of an ACA film of the invention.

Referring to FIG. 2A, an ACA film 110 of the invention has a tripe layered structure defined by a lower adhesion reinforcing layer 114A, a main ACA film 112 and an upper reinforcing layer 114B.

The main ACA film 112 is made of an epoxy resin-based material, and has a structure in which conductive particles 120 having a size range of about 3 to 10 μm and non-conductive particles 160 having a size range of 0.1 to 1 μm, are finely dispersed.

The main ACA film 112 is interposed between the lower adhesion reinforcing layer 114a and the upper adhesion reinforcing layer 114b. The lower and upper adhesion reinforcing layers 114a and 114b each is made of epoxy resin-based material and have a thickness range of 1 to 10 μm. The lower and upper adhesion reinforcing layers 114a and 114b each may further contain the conductive particles by 5 to 10% by weight in order to have conductivity. Releasing films 130a and 130b are attached to both sides of the triple layered ACA film 110.

The triple layered ACA film 110 is fabricated as follows:

First, a composition is prepared by mixing solid epoxy resin; liquid epoxy resin; solid phenoxy resin; solvent in which methylethylketone and toluene are mixed with each other at a mixing ratio of 1 to 3; and liquid imidazole hardener. The resultant composition is coated on the lower releasing film 130a composed of polyethylene with a comma roll coater, and then B-stage cured to form the lower adhesion reinforcing layer 114a.

Then, another composition is prepared by mixing solid epoxy resin; liquid epoxy resin; solid phenoxy resin; solvent in which methylethylketone and toluene are mixed with each other at a mixing ratio of 1 to 3; conductive particles having a particle size of 3 to 10 μm; non-conductive particles having a particle size of 0.1 to 1 μm; and liquid imidazole hardener. The composition is coated on the lower adhesion reinforcing layer 114a. The conductive particles are mixed to have about 5 to 20% by weight with respect to the overall weight excluding the weight the solvent, and the non-conductive particles are mixed to have about 0 to 50% by weight with respect to the overall weight excluding the weight of the solvent. The coated composition is dried at a temperature range of 80 to 100° C. for 1 to 3 minutes until the solvent is sufficiently vaporized so as to form a main ACA film 112 at a thickness of 30 to 40 μm.

The first composition is prepared by mixing solid epoxy resin; liquid epoxy resin; solid phenoxy resin; solvent in which methylethylketone and toluene are mixed with each other at a mixing ratio of 1 to 3; conductive particles having a particle size of 3 to 10 μm; non-conductive particles having a particle size of 0.1 to 1 μm; and liquid imidazole hardener. The composition is coated on the main ACA film 112 with the comma roll coater and then laminated through the heat compression to form the upper adhesion reinforcing layer 114b. Finally, an upper releasing film 130b is attached to the upper adhesion reinforcing layer 114b.

Figure 1A:
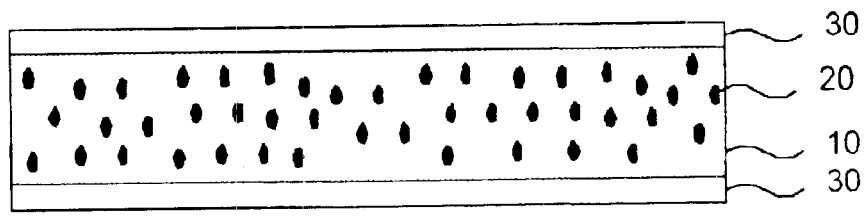
FIG. 1A is a sectional view of a conventional ACA film.
Figure 1B:
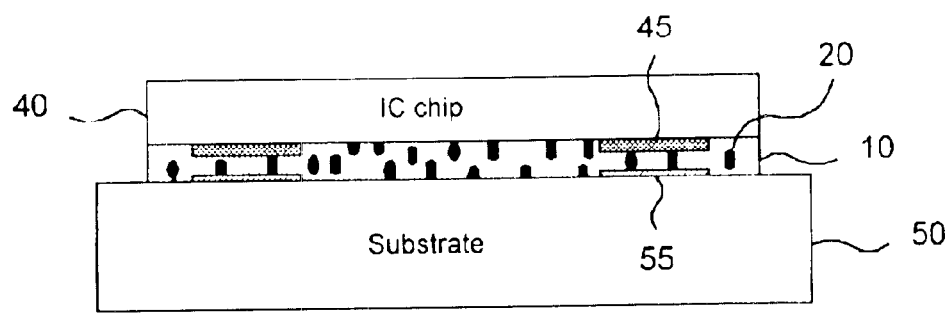
FIG. 1B is a sectional view for illustrating a flip chip bonding state by using the ACA film shown in FIG. 1A.
Figure 1C:
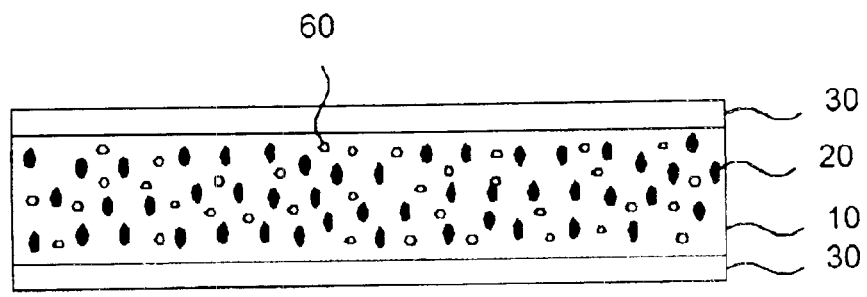
FIG. 1C is a sectional view of an improved conventional ACA film.
Figure 2B:
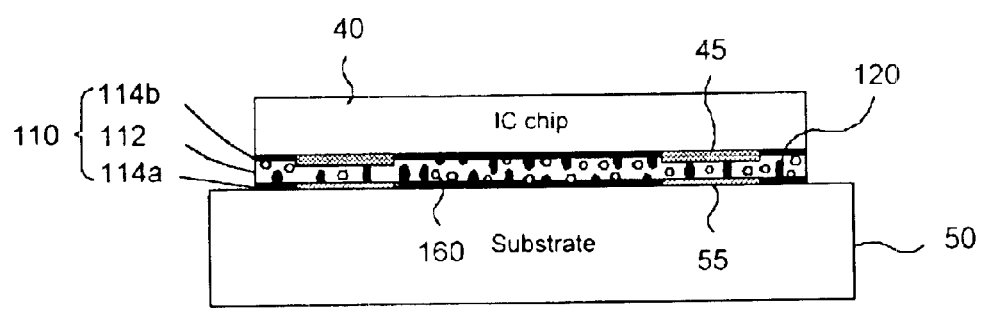
FIG. 2B is a sectional view for illustrating an exemplary flip chip bonding state by using the ACA film shown in FIG. 2A.

FIG. 2B is a sectional view illustrating an exemplary flip chip bonding state by using the triple layered ACA film 110 shown in FIG. 2A, in which the same reference numerals are used to designate the same or similar components as in FIG. 1B. The lower releasing film 130a is removed and then the exposed lower adhesion reinforcing layer 114a is heat-pressed against a substrate 50 at 80° C. under a pressure of 1 to 3 kgf/cm$^2$. Then, the upper releasing film 130b is removed and then the substrate 50 is heat-pressed with an IC chip 40 after aligned therewith.

Alternatively, the lower and upper adhesion reinforcing layers 114a and 114b each may contain thermoplastic resin such as polyurethane and acrylic resin 0 to 10% by weight. This allows the IC chip 40 to be readily separated from the substrate 50 at a small quantity of heat and thus it is advantageous where the IC chip 40 requires repair.

According to the triple layered ACA film of the invention as set forth above, although the non-conductive particles are finely dispersed in the ACA film for the purpose of enhancing the adhesion strength of a general single layer ACF or reducing thermal expansion coefficient, the adhesion strength of the ACA film is enhanced owing to the epoxy resin based adhesion reinforcing layer so that the IC chip is strongly adhered with the substrate. Further, the thermoplastic resin is partially contained in the adhesion-reinforcing layer so that the IC chip can be separated under repair.

Although the invention has been shown and described with reference to the certain preferred embodiment thereof, it will be understood by those skilled in the art that various changes in form and details may be made therein without departing from the spirit and scope of the invention as defined by the appended claims.

What is claimed is:

1. A triple layered anisotropic conductive adhesive (ACA) film comprising:

an epoxy resin-containing main ACA film containing conductive particles having a particle size of 3 to 10 μm and non-conductive particles having a particle size of 0.1 to 1 μm; and epoxy resin-containing adhesion reinforcing layers formed at both sides of the epoxy resin-containing main ACA film, wherein the main ACA film is formed by mixing and drying solid epoxy resin, liquid epoxy resin, solid phenoxy resin, solvent in which methylethylketone and toluene are mixed with each other, and liquid imidazole hardener, wherein the conductive particles have a concentration of 5 to 20% by weight with respect to the overall weight excluding the weight of the solvent.

2. The triple layered ACA film according to claim 1, wherein the adhesion reinforcing layers each further contain 5–10% by weight of conductive particles.

3. The triple layered ACA film according to claim 1, wherein the adhesion reinforcing layers each are formed by mixing and drying solid epoxy resin, liquid epoxy resin, solid phenoxy resin, solvent in which methylethylketone and toluene are mixed with each other, and liquid imidazole hardener.

4. The triple layered ACA film according to claim 1, wherein the main ACA film has a thickness range of 25–50 $\mu$m and each of the adhesion reinforcing layers has a thickness range of 1–10 $\mu$m.

5. The triple layered ACA film according to claim 1, wherein the adhesion reinforcing layers each contain 0–10% by weight of thermoplastic resin.

6. A triple layered anisotropic conductive adhesive (ACA) film comprising:

an epoxy resin-containing main ACA film containing conductive particles having a particle size of 3 to 10 $\mu$m and non-conductive particles having a particle size of 0.1 to 1 $\mu$m; and epoxy resin-containing adhesion reinforcing layers formed at both sides of the epoxy resin-containing main ACA film, wherein the adhesion reinforcing layers each are formed by mixing and drying solid epoxy resin, liquid epoxy resin, solid phenoxy resin, solvent in which methylethylketone and toluene are mixed with each other, and liquid imidazole hardener.

* * * * *